(12) United States Patent
Wang et al.

(10) Patent No.: US 9,331,674 B2
(45) Date of Patent: May 3, 2016

(54) MULTI-PHASE SIGNAL GENERATOR AND MULTI-PHASE SIGNAL GENERATING METHOD THEREOF

(71) Applicant: Intel Corporation, Santa Clara, CA (US)

(72) Inventors: Yu-Chung Wang, New Taipei (TW); Yen-Chin Chen, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/449,161

(22) Filed: Aug. 1, 2014

(65) Prior Publication Data

US 2015/0244350 A1   Aug. 27, 2015

(30) Foreign Application Priority Data

Feb. 27, 2014   (CN) .......................... 2014 1 0069331

(51) Int. Cl.
*H03K 5/15*   (2006.01)
*H03K 3/012*   (2006.01)
*H03K 5/01*   (2006.01)
*H03K 5/00*   (2006.01)

(52) U.S. Cl.
CPC .............. *H03K 3/012* (2013.01); *H03K 5/01* (2013.01); *H03K 5/15013* (2013.01); *H03K 2005/00286* (2013.01)

(58) Field of Classification Search
USPC .................. 327/165, 231, 258, 291, 293, 295
See application file for complete search history.

(56) References Cited

U.S. PATENT DOCUMENTS

| | | | | |
|---|---|---|---|---|
| 7,138,841 B1 * | 11/2006 | Li | ........................... | H03K 5/151 327/175 |
| 8,648,639 B2 * | 2/2014 | Lee | ....................... | H02M 3/156 327/172 |
| 2001/0026179 A1 * | 10/2001 | Saeki | ..................... | H03K 5/131 327/147 |
| 2004/0034724 A1 | 2/2004 | Bruner et al. | | |

FOREIGN PATENT DOCUMENTS

| | | |
|---|---|---|
| CN | 101557161 A | 10/2009 |
| CN | 101803193 A | 8/2010 |
| CN | 102931837 A | 2/2013 |

OTHER PUBLICATIONS

Office Action dated Jan. 4, 2016 for Chinese Patent Application No. 201410069331.0.

* cited by examiner

*Primary Examiner* — An Luu
(74) *Attorney, Agent, or Firm* — Schiff Hardin LLP

(57) ABSTRACT

A multi-phase signal generator and a multi-phase signal generating method thereof. The multi-phase signal generator includes a signal generator, a first comparator, a second comparator and a logic operation circuit. The signal generator generates a periodic signal. The first comparator receives the periodic signal and respectively compares the periodic signal with a first reference voltage and a second reference voltage to generate a first output signal. The second comparator receives the periodic signal and compares the periodic signal with a first threshold voltage to generate a second output signal. The logic operation circuit performs logic operations on the first output signal and the second output signal so as to generate a plurality of first phase output signals.

10 Claims, 5 Drawing Sheets

MULTI-PHASE SIGNAL GENERATOR AND MULTI-PHASE SIGNAL GENERATING METHOD THEREOF

CROSS-REFERENCE TO RELATED APPLICATION

This application claims the priority benefit of China application serial no. 201410069331.0, filed on Feb. 27, 2014. The entirety of the above-mentioned patent application is hereby incorporated by reference herein and made a part of this specification.

BACKGROUND OF THE INVENTION

1. Field of the Invention

The invention generally relates to a multi-phase signal generator and a generating method thereof, and more particularly, to a multi-phase signal generator and a multi-phase signal generating method thereof with low power-consumption.

2. Description of Related Art

In current technology field, a multi-phase signal generator often uses an oscillation circuit to provide an oscillation signal having a precision frequency, uses a plurality of delay circuits to make the oscillation signal delayed in different extents, and then performs logic operations on the delayed oscillation signals so as to generate a plurality of phase signals with different phases. By means of such scheme, the oscillation frequency generated by the oscillation circuit is hard to be fixed and the delays provided by the delay circuits are hard to be controlled. Thus, it is easy for the generated multi-phase signals to become staggered overlapping signals and causes signal interference.

Another scheme in the prior art is to use frequency multiplication manner for generating an oscillation signal with relative high frequency, followed by performing, for example, a logic operation processing by using the generated oscillation signal with relative high frequency. This scheme requires a frequency multiplication processing. During the processing on the oscillation signal with relative high frequency, it needs massive power-consumption so as to unnecessarily waste energy.

In short, a more energy-saving and more precise multi-phase signal generator is needed to be developed in this technical field.

SUMMARY OF THE INVENTION

Accordingly, the invention is directed to a multi-phase signal generator and a multi-phase signal generating method thereof which can effectively reduce the required power-consumption.

A multi-phase signal generator of the invention includes a signal generator, a first comparator, a second comparator and a logic operation circuit. The signal generator generates a periodic signal. The first comparator is coupled to the signal generator to receive the periodic signal and respectively compares the periodic signal with a first reference voltage and a second reference voltage to generate a first output signal. The second comparator is coupled to the signal generator to receive the periodic signal and compares the periodic signal with a first threshold voltage to generate a second output signal. The logic operation circuit is coupled to the first comparator and the second comparator and performs logic operations on the first output signal and the second output signal so as to generate a plurality of first phase output signals.

A multi-phase signal generating method of the invention includes: generating a periodic signal; comparing the periodic signal respectively with a first reference voltage and a second reference voltage to generate a first output signal; comparing the periodic signal with a first threshold voltage to generate a second output signal; and performing logic operations on the first output signal and the second output signal so as to generate a plurality of first phase output signals.

Based on the depiction above, the invention uses a plurality of reference voltages and threshold voltages after setting to compare the periodic signal with them and uses the output signals generated by the comparing operations to perform logic operations so as to effectively generate a multi-phase signal. Under the condition, there is no need to perform frequency multiplication on the periodic frequency signal, which can effectively lower down the power-consumption of the multi-phase signal generator. In addition, by setting the reference voltages and the threshold voltages, the generated multi-phase signal has no phenomena of overlapping signals, which can effectively prevent the signal interference due to signal coupling.

In order to make the features and advantages of the present invention more comprehensible, the present invention is further described in detail in the following with reference to the embodiments and the accompanying drawings.

DESCRIPTION OF THE EMBODIMENTS

Figure 1:
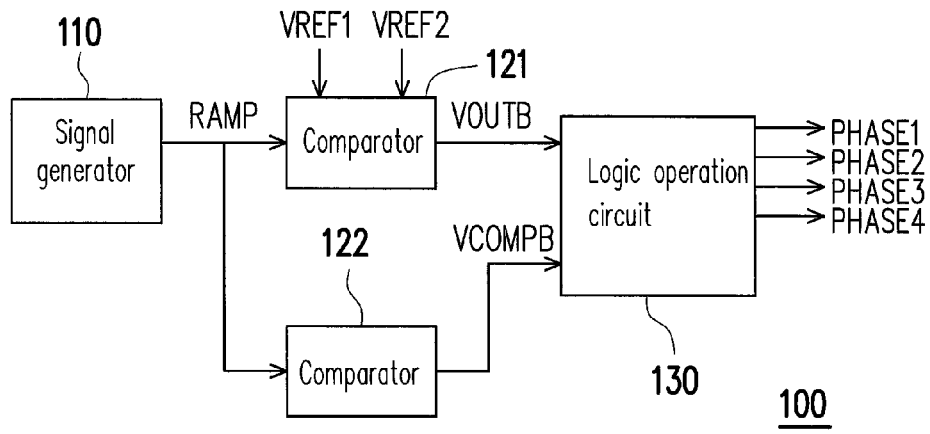
FIG. 1 is a schematic diagram of a multi-phase signal generator according to an embodiment of the invention.

FIG. 1 is a schematic diagram of a multi-phase signal generator according to an embodiment of the invention. Referring to FIG. 1, a multi-phase signal generator 100 includes a signal generator 110, two comparators 121 and 122 and a logic operation circuit 130. The signal generator 110 is configured to generate a periodic signal RAMP. The comparators 121 and 122 are coupled to the signal generator 110 to receive the periodic signal RAMP. The comparator 121 compares the periodic signal RAMP with a reference voltage VREF1 and with another reference voltage VREF2 to generate an output signal VOUTB, in which the values of the reference voltage VREF1 and the reference voltage VREF2 are different from each other. The value of the reference voltage VREF1 can be greater than the value of the reference voltage VREF2. When the output signal VOUTB generated by the comparator 121 is at the high logic-level, the reference voltage VREF2 is provided to the comparator 121, and the comparator 121 compares the periodic signal RAMP with the reference voltage VREF2; when the output signal VOUTB is lower than the reference voltage VREF2, the comparator 121 switches the generated output signal VOUTB to the low logic-level.

On contrary, when the output signal VOUTB generated by the comparator 121 is at the low logic-level, the reference voltage VREF1 is provided to the comparator 121, and the comparator 121 compares the periodic signal RAMP with the reference voltage VREF1; when the periodic signal RAMP is higher than the reference voltage VREF1, the comparator 121 switches the generated output signal VOUTB to the high logic-level.

It can be seen that through the comparison between the periodic signal RAMP and the reference voltage VREF1/reference voltage VREF2, the comparator 121 can generate a periodic output signal RAMP with a fixed frequency.

The peak voltage of the periodic signal RAMP is not less than the reference voltage VREF1, while the valley voltage of the periodic signal RAMP is not greater than the reference voltage VREF2.

The comparator 122 performs comparing between the periodic signal RAMP and a threshold voltage so as to generate an output signal VCOMPB. In more details, the comparator 122 compares the value of the periodic signal RAMP with the value of the threshold voltage to decide the logic-level of the generated output signal VCOMPB according to whether or not the value of the periodic signal RAMP is greater than the value of the threshold voltage. For example, when the value of the periodic signal RAMP is greater than the value of the threshold voltage, the logic-level of the output signal VCOMPB can be a high logic-level; on contrary, when the value of the periodic signal RAMP is less than the value of the threshold voltage, the logic-level of the output signal VCOMPB can be a low logic-level.

The aforementioned relationship between the logic-level of the output signal VCOMPB and the comparing result obtained by the comparator is one example only, which the invention is not limited to. Any designer skilled in the art can set the relationship depending on the actual requirement without limitation.

The value of the threshold voltage is between the values of the reference voltage VREF1 and the reference voltage VREF2. In other words, the output signal VCOMPB and the output signal VOUTB are two periodic signals with a phase difference and a same frequency.

The logic operation circuit 130 receives the output signal VCOMPB and the output signal VOUTB on both which the logic operation circuit 130 performs logic operations so as to generate a plurality of multi-phase signals PHASE1-PHASE4 with different phases. When the output signal VCOMPB and the output signal VOUTB has a phase difference, the logic operation circuit 130 can generate four multi-phase signals PHASE1-PHASE4 with different phases according to the output signal VCOMPB and the output signal VOUTB.

Figure 2:
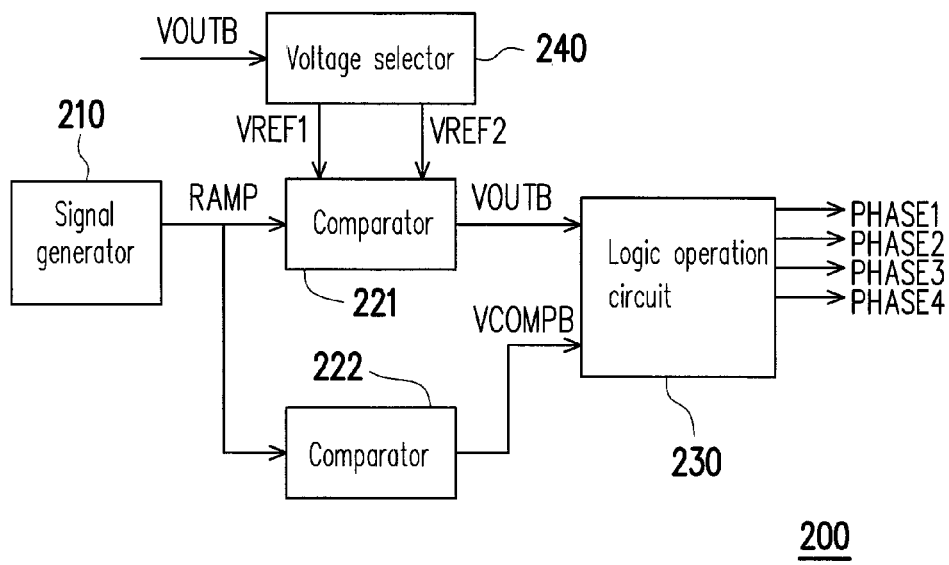
FIG. 2 is a schematic diagram of a multi-phase signal generator according to another embodiment of the invention.

FIG. 2 is a schematic diagram of a multi-phase signal generator according to another embodiment of the invention. Referring to FIG. 2, a multi-phase signal generator 200 includes a signal generator 210, two comparators 221 and 222, a logic operation circuit 230 and a voltage selector 240. The difference from the aforementioned embodiment rests in that the embodiment also employs the voltage selector 240 to provide the reference voltage VREF1 and the reference voltage VREF2 to the comparator 221. The voltage selector 240 is coupled to the comparator 221. The voltage selector 240 receives the output signal VOUTB and, according to the output signal VOUTB, selects the reference voltage VREF1 or the reference voltage VREF2 to be provided to the comparator 221. In more details, when the output signal VOUTB is at the high logic-level, the voltage selector 240 provides the comparator 221 with the reference voltage VREF2 of relatively-low voltage value; when the output signal VOUTB is at the low logic-level, the voltage selector 240 provides the comparator 221 with the reference voltage VREF1 of relatively-high voltage value.

Figure 3:
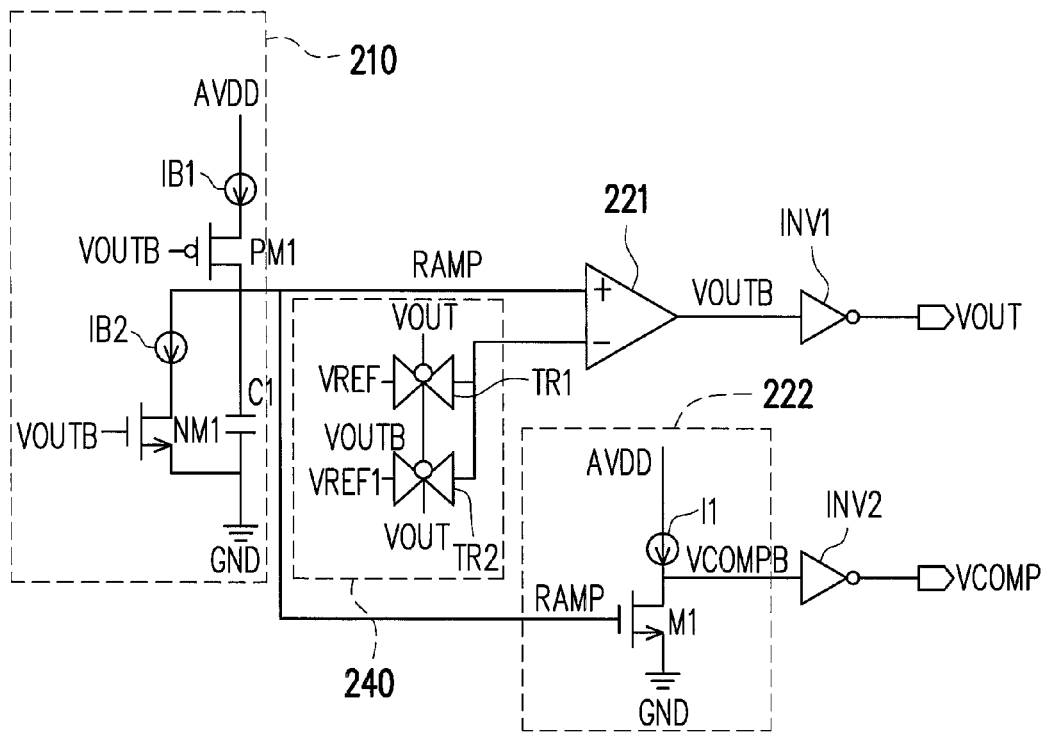
FIG. 3 shows an implementation of the multi-phase signal generator 200 in the embodiment of FIG. 2.
Figure 3:
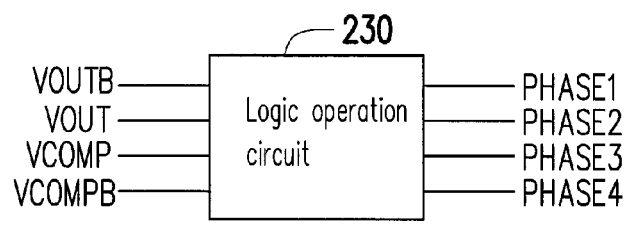

FIG. 3 shows an implementation of the multi-phase signal generator 200 in the embodiment of FIG. 2. Referring to FIG. 3, the signal generator 210 in FIG. 3 includes two current sources IB1 and IB2, two transistors PM1 and NM1 and a capacitor C1. The current sources IB1 and IB2 respectively provide a same reference current, and the transistors PM1 and NM1 respectively serve as a switch. The current source IB1 is coupled between an operation power AVDD and the transistor PM1, and the current source IB1 provides the transistor PM1 with the reference current. The current source IB2 is coupled between the transistor PM1 and the transistor NM1 and provides the transistor NM1 with a first reference current and a second reference current. The capacitor C1 is coupled between the transistor PM1 and a reference ground terminal GND. The transistor PM1 receives the output signal VOUTB and the transistor PM1 is turned on or off according to the output signal VOUTB, while the transistor NM1 receives the output signal VOUTB and is turned on or off according to the output signal VOUTB.

When the output signal VOUTB is at the high logic-level, the transistor NM1 is turned off, and the transistor PM1 is turned on according to the output signal VOUTB. At the time, the current source IB1 provides the capacitor C1 with the first reference current for charging and generating a linearly-rising periodic signal RAMP. When the periodic signal RAMP rises to a sufficient voltage, the reverse signal VOUT of the output signal VOUTB changes to the low logic-level from the high logic-level. Meanwhile, the transistor NM1 is turned on and the transistor PM1 is turned off. The current source IB2 provides a second reference current to make the capacitor C1 discharged and make the periodic signal RAMP linearly falling. When the voltage of the periodic signal RAMP gets a low-enough level, the reverse signal VOUT changes to the high logic-level from the low logic-level. In the embodiment, the periodic signal RAMP is implemented with a triangle wave signal. The triangle wave signal has good linear characteristic to facilitate all the comparators finding out time-points for switching the levels. It is sure any people skilled in the art can use other periodic signals, such as sine wave, cosine wave, etc. to implement the periodic signal RAMP following the idea of the invention.

In brief, the embodiments of the invention can control the slope of the curve variation of the periodic signal RAMP through producing the precise first reference current and second reference current so that the frequency of the periodic signal RAMP is precisely controlled. In addition, the signal generator 210 is a signal-generating circuit with frequency multiplication of one, i.e., it does not need perform a higher frequency multiplication action so as to effectively save the power-consumption.

The voltage selector 240 is composed of two transmission gates TR1 and TR2. The structures of the transmission gates TR1 and TR2 are the same, i.e., each is composed of a PMOS and an NMOS. The transmission gates TR1 and TR2 are controlled by the output signal VOUTB and the reverse signal VOUT of the output signal VOUTB to send the reference voltage VREF and the reference voltage VREF1 to the comparator 221. In particular, the on/off states of the transmission gates TR1 and TR2 are complementary to each other. Although the structures of the transmission gates TR1 and TR2 are the same and they are controlled by the output signal VOUTB and the reverse signal VOUT of the output signal VOUTB, the input ways of the two signals VOUTB and VOUT are opposite. As a result, when the TR1 is on, the TR2 is off. At the time, the reference voltage VREF is input to the comparator 221. When the TR2 is on, the TR1 is off. At the time, the reference voltage VREF1 is input to the comparator 221. The value of the reference voltage VREF1 is greater than the value of the reference voltage VREF.

The comparator 222 includes a transistor M1 and a current source I1. The first terminal and the second terminal of the transistor M1 are respectively coupled to the current source I1 and the reference ground terminal GND. The control terminal of the transistor M1 receives the periodic signal RAMP. The current source I1 provides a current to the first terminal of the transistor M1. At the time, when the value of the periodic signal RAMP is greater than the threshold voltage of the transistor M1, the transistor M1 is turned on to lower down the output signal VCOMPB to the low logic-level. On contrary, when the value of the periodic signal RAMP is not greater than the threshold voltage of the transistor M1, the transistor M1 is turned off to increase the output signal VCOMPB to the high logic-level through the current source I1.

The output terminals of the comparators 221 and 222 can be respectively coupled to an inverter INV1 and an inverter INV2. The inverters INV1 and INV2 respectively generate the reverse signal VOUT of the output signal VOUTB and the reverse signal VCOMP of the output signal VCOMPB.

Figure 4:
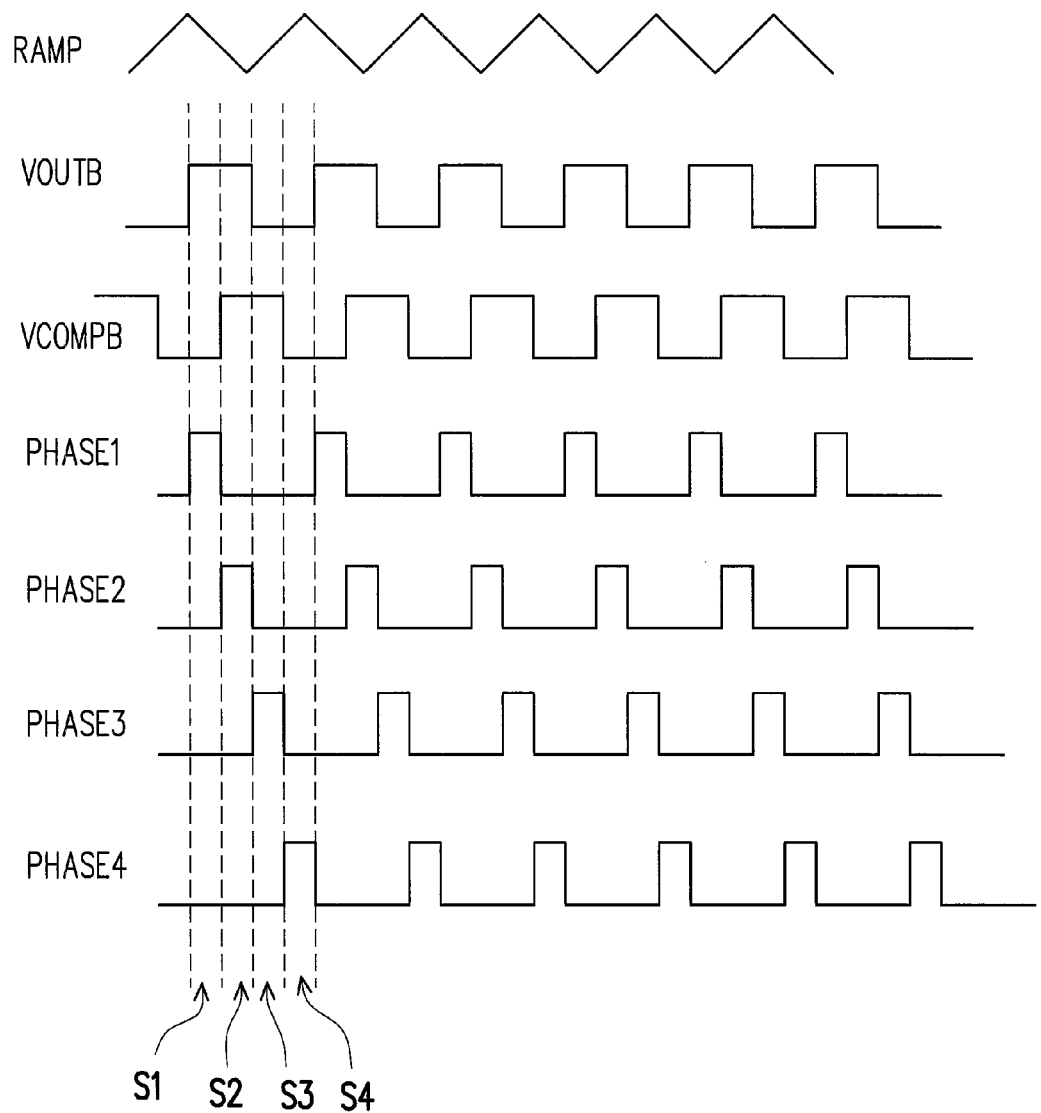
FIG. 4 shows a wave diagram of a multi-phase signal generator in the embodiment of the invention.

Thus, the logic operation circuit 230 may generate the multi-phase signals PHASE1-PHASE4 according to the output signals VOUTB and VCOMPB and the reverse signals VOUT and reverse signal VCOMP. In terms of the logic operation of the logic operation circuit 230, it can refer to FIG. 4. FIG. 4 shows a wave diagram of a multi-phase signal generator in the embodiment of the invention. In state S1, the logic operation circuit 230 generates the multi-phase signal PHASE1 with the high logic-level according to the output signal VOUTB with the high logic-level and the reverse signal VCOMP with the low logic-level; in state S2, the logic operation circuit 230 generates the multi-phase signal PHASE2 with the high logic-level according to the output signal VOUTB with the high logic-level and the reverse signal VCOMP with the high logic-level; in state S3, the logic operation circuit 230 generates the multi-phase signal PHASE3 with the high logic-level according to the output signal VOUTB with the low logic-level and the reverse signal VCOMP with the high logic-level; in state 4, the logic operation circuit 230 generates the multi-phase signal PHASE4 with the high logic-level according to the output signal VOUTB with the low logic-level and the reverse signal VCOMP with the low logic-level.

Figure 5:
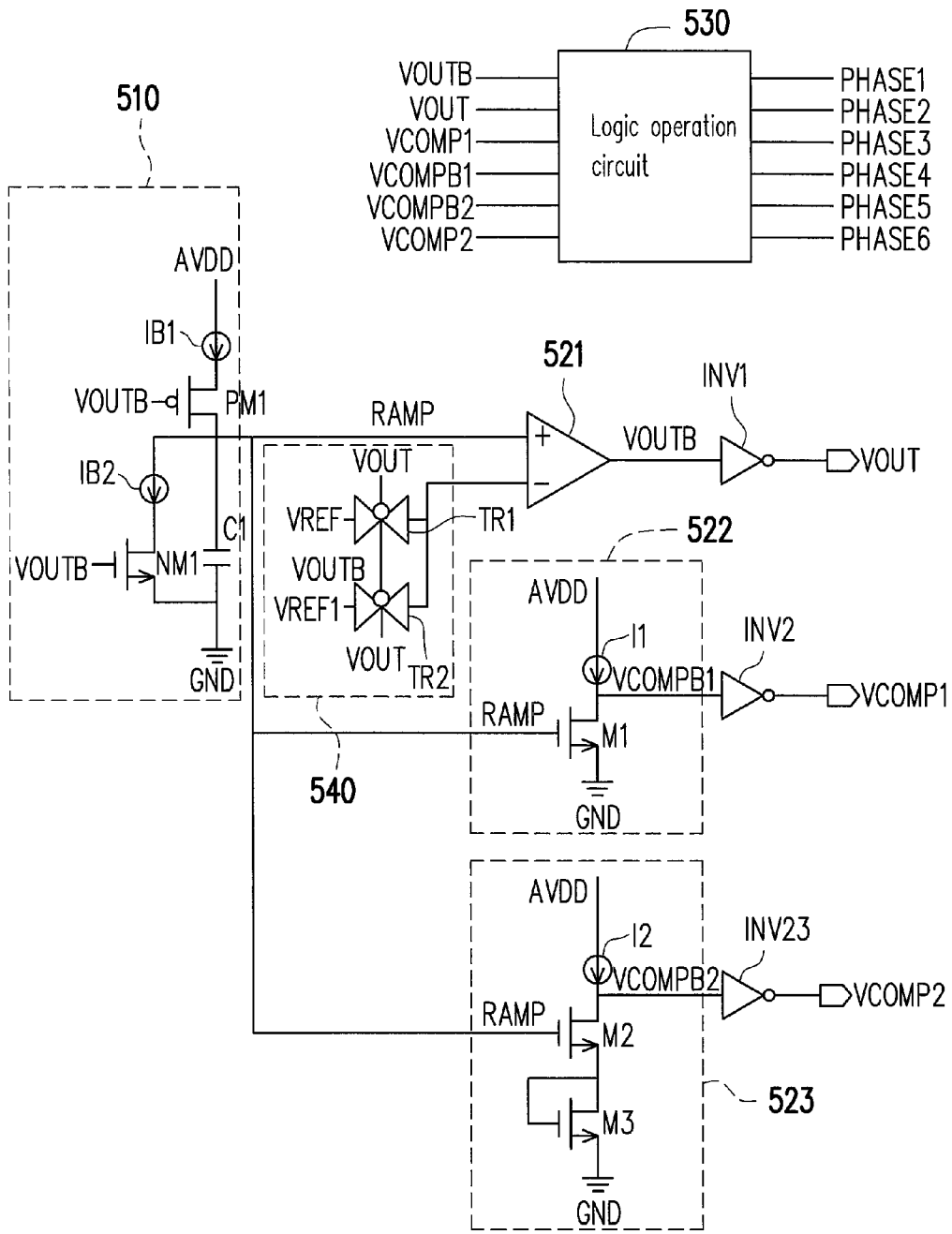
FIG. 5 is a schematic diagram of a multi-phase signal generator according to another embodiment of the invention.

FIG. 5 is a schematic diagram of a multi-phase signal generator according to another embodiment of the invention. Referring to FIG. 5, a multi-phase signal generator 500 includes a signal generator 510, three comparators 521, 522 and 523, a logic operation circuit 530 and a voltage selector 540. Different from the embodiment of FIG. 3, the multi-phase signal generator 500 herein further includes the comparator 523. The comparator 523 includes a current source I2 and two transistors M2 and M3. The first terminal and the second terminal of the transistor M2 are respectively coupled to the current source I2 and the first terminal of the transistor M3. The control terminal of the transistor M2 receives the periodic signal RAMP. The transistor M3 is configured to build a diode. The first terminal of the transistor M3 is coupled to the control terminal to form the anode of the diode, and the second terminal of the transistor M3 forms the cathode of the diode and is coupled to the reference ground terminal GND.

The comparator 523 compares the periodic signal RAMP with the sum of the threshold voltage of the transistor M2 and the threshold voltage of the transistor M3. If the threshold voltages of the transistors M2 and M3 are the same, the comparator 523 compares the periodic signal RAMP with a double threshold voltage so as to generate an output signal VCOMPB2.

In addition, the output terminal of the comparator 523 is coupled to the input terminal of the inverter INV3 and generates a reverse signal VCOMP2 of the output signal VCOMPB2 through the inverter INV3.

It should be noted that the logic operation circuit 530 in the embodiment can generate six multi-phase signals PHASE1-PHASE6 according to the output signals VOUTB, VCOMPIB and VCOMP2B and the reverse signals VOUT and VCOMP1 and VCOMP2.

When the quantity of the desired multi-phase signals is more, according to the embodiment, it can be achieved by increasing the number of the comparators to compare the periodic signal RAMP with an integer times of the threshold voltage for generating the output signals, followed by performing logic operations on a plurality of output signals and the reverse signals thereof for generating sufficient number of the multi-phase signals.

Figure 6:
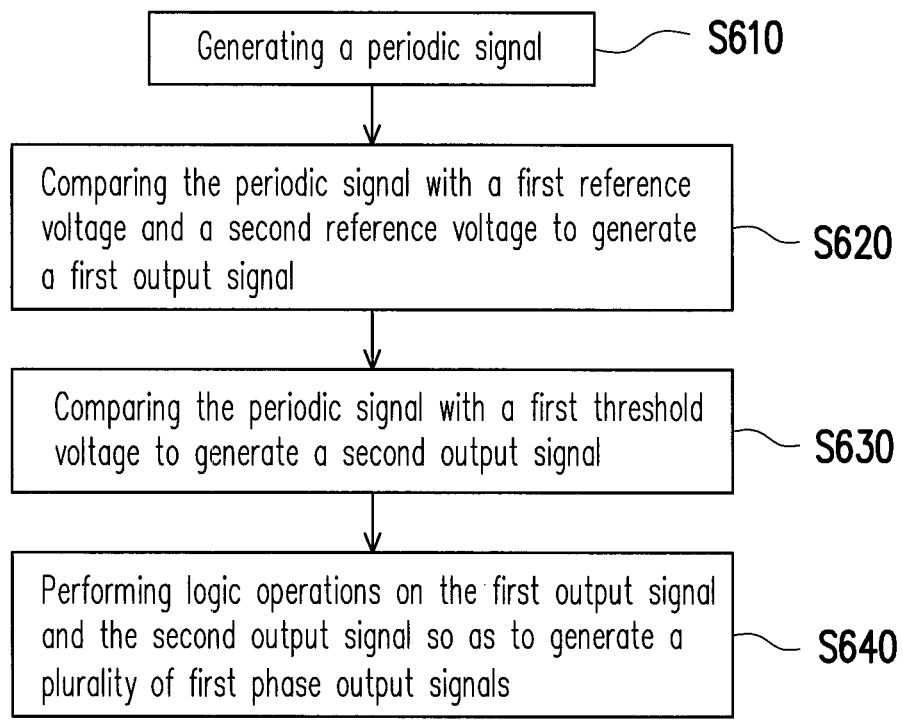
FIG. 6 is a schematic flowchart of a multi-phase signal generating method according to an embodiment of the invention.

FIG. 6 is a schematic flowchart of a multi-phase signal generating method according to an embodiment of the invention. In step S610, a periodic signal is generated. In step S620, the periodic signal is respectively compared with a first reference voltage and a second reference voltage so as to generate a first output signal. Then in step S630, the periodic signal is compared with a first threshold voltage to generate a second output signal. In step S640, a logic operation is performed on the first output signal and the second output signal to generate a plurality of first phase output signal.

The details of the aforementioned steps can refer to the described embodiments, which is omitted to describe.

In summary, the invention does not need to perform a higher frequency multiplication action than multiplication of one, which can save energy. By using comparators with low power-consumption can also lower down the power-consumption. In addition, the invention uses the comparators to compare the periodic signal with a plurality of reference voltages and threshold voltages to generate a plurality of output signals and generate the multi-phase signal according to the output signals. In this way, by setting the reference voltages and threshold voltages, the generated multi-phase signal can avoid the phenomena of overlapping signals so as to effectively prevent the possible signal interference.

What is claimed is:

1. A multi-phase signal generator, comprising:
    a first comparator, receiving a periodic signal and respectively comparing the periodic signal with a first reference voltage and a second reference voltage to generate a first output signal;
    a second comparator, receiving the periodic signal and comparing the periodic signal with a first threshold voltage to generate a second output signal; and
    a logic operation circuit, coupled to the first comparator and the second comparator and performing logic operations on the first output signal and the second output signal so as to generate a plurality of first phase output signals.

2. The multi-phase signal generator as claimed in claim 1, wherein the second comparator comprises:
    a current source, providing a reference current; and
    a transistor, having a first terminal, a second terminal and a control terminal, wherein the first terminal of the transistor receives the reference current and generates the second output signal, the control terminal of the transistor receives the periodic signal and the second terminal of the transistor is coupled to a reference ground terminal.

3. The multi-phase signal generator as claimed in claim 1, further comprising:
   a signal generator, coupled to the first capacitor and the second capacitor and generating the periodic signal; and
   at least one third comparator, coupled to the signal generator to receive the periodic signal, wherein the at least one third comparator compares the periodic signal with a second threshold voltage to generate a third output signal.

4. The multi-phase signal generator as claimed in claim 3, wherein the value of the second threshold voltage is an integer times of the value of the first threshold voltage.

5. The multi-phase signal generator as claimed in claim 3, wherein the logic operation circuit performs logic operations on the first output signal, the second output signal and the third output signal to generate a plurality of second phase output signals.

6. The multi-phase signal generator as claimed in claim 3, wherein the at least one third comparator comprises:
   a current source, generating a reference current;
   a first transistor, having a first terminal, a second terminal and a control terminal, wherein the first terminal of the first transistor receives the reference current and generates the third output signal and the control terminal of the first transistor receives the periodic signal; and
   at least one diode, wherein anode of the diode is coupled to the second terminal of the first transistor and cathode of the diode is coupled to the reference ground terminal.

7. The multi-phase signal generator as claimed in claim 1, further comprising:
   a voltage selector, coupled to the first comparator and receiving the first output signal and selecting the first reference voltage or the second reference voltage to be sent to the first comparator according to the first output signal, wherein the value of the first reference voltage is greater than the value of the second reference voltage.

8. The multi-phase signal generator as claimed in claim 3, wherein the signal generator comprises:
   a first current source, providing a first reference current;
   a first switch, wherein the first terminal of the first switch receives the first reference current so as to be turned on or off according to the first output signal;
   a capacitor, coupled between the second terminal of the first switch and the reference ground terminal;
   a second current source, coupled to the second terminal of the first switch and providing a second reference current; and
   a second switch, wherein the first terminal of the second switch receives the second reference current and the second terminal of the second switch is coupled to the reference ground terminal.

9. A multi-phase signal generating method, comprising:
   receiving a periodic signal;
   comparing the periodic signal with a first reference voltage and a second reference voltage to generate a first output signal;
   comparing the periodic signal with a first threshold voltage to generate a second output signal; and
   performing logic operations on the first output signal and the second output signal so as to generate a plurality of first phase output signals.

10. The multi-phase signal generating method as claimed in claim 9, further comprising:
   comparing the periodic signal with a second threshold voltage to generate a third output signal; and
   performing logic operations on the first output signal, the second output signal and the third output signal so as to generate a plurality of second phase output signals
   wherein, the value of the second threshold voltage is an integer times of the value of the first threshold voltage.

* * * * *